United States Patent [19]

Iwase et al.

[11] Patent Number: 4,862,403

[45] Date of Patent: Aug. 29, 1989

[54] DIGITAL FILTER

[75] Inventors: Seiichiro Iwase, Sagamihara, Japan; Takao Yamazaki, Goleta, Calif.

[73] Assignee: Sony Corporation, Tokyo, Japan

[21] Appl. No.: 797,845

[22] Filed: Nov. 14, 1985

[30] Foreign Application Priority Data

Nov. 14, 1984 [JP] Japan ................................ 59-240311

[51] Int. Cl.$^4$ ............................................. G03F 7/38
[52] U.S. Cl. ............................................. 364/724.16
[58] Field of Search ..................... 364/724; 375/11-14; 333/18

[56] References Cited

U.S. PATENT DOCUMENTS

| | | | |
|---|---|---|---|
| 3,521,041 | 7/1970 | Blerkom et al. | 364/724 |
| 3,949,206 | 4/1976 | Edwards et al. | 364/724 |
| 4,031,378 | 6/1977 | Le Comte | 364/724 |
| 4,044,241 | 8/1977 | Hatley, Jr. | 364/724 |
| 4,121,295 | 10/1978 | Witt | 364/724 |

OTHER PUBLICATIONS

Goncalves et al., "LSI Module for the Implementation of Digital Filters", IEE Proc., vol. 128, Pt. F, No. 6, Nov. 1981, pp. 353-358.

Bywater et al., "A Real-Time Non-Recursive Digital Filter", Int. J. Electronics, Sep. 1978, vol. 45, No. 3, pp. 265-271.

Primary Examiner—Gary V. Harkcom
Assistant Examiner—Tan V. Mai
Attorney, Agent, or Firm—Lewis H. Eslinger; Donald S. Dowden

[57] ABSTRACT

A digital filter has an input terminal provided with an input digital signal. A delay circuit connected to the input terminal produces a plurality of delayed digital signals each having a different delay time with respect to the input digital signal. A first circuit adds the input digital signal and/or the plurality of delayed digital signals to one or more digital coefficient signals of the same value so as to produce one or more added digital signals. A circuit multiplies the one or more respective digital coefficient signals by the one or more added digital signals and/or one or more of the plurality of delayed digital signals to produce a plurality of multiplied digital signals. A second circuit adds the plurality of multiplied digital signals to produce an output digital signal, and a circuit connected between the delay circuit and a multiplying circuit increases the one or more added digital signals and/or the one or more of the plurality of delayed digital signals by one or more predetermined numbers of times, whereby the one or more respective digital coefficient signals have inversely proportional values corresponding to the one or more predetermined numbers of times of the values of the one or more added digital signals and/or the one or more of the plurality of delayed digital signals.

2 Claims, 8 Drawing Sheets

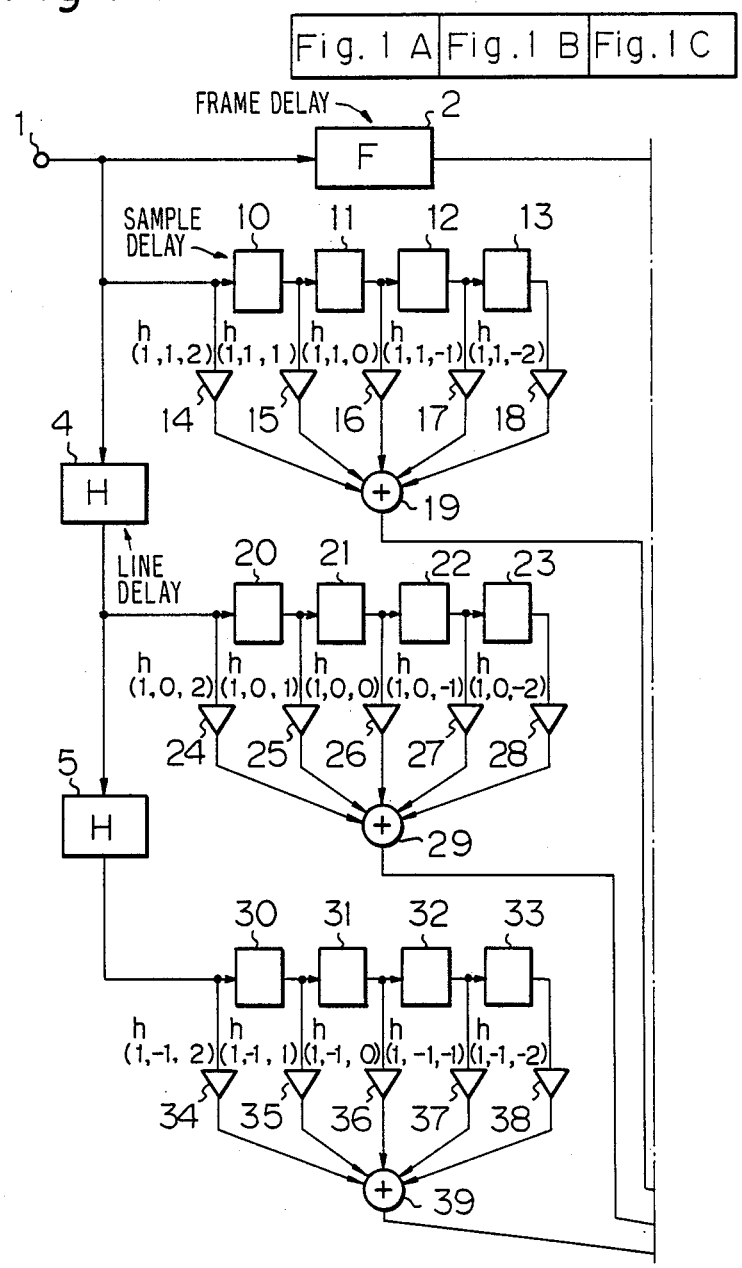

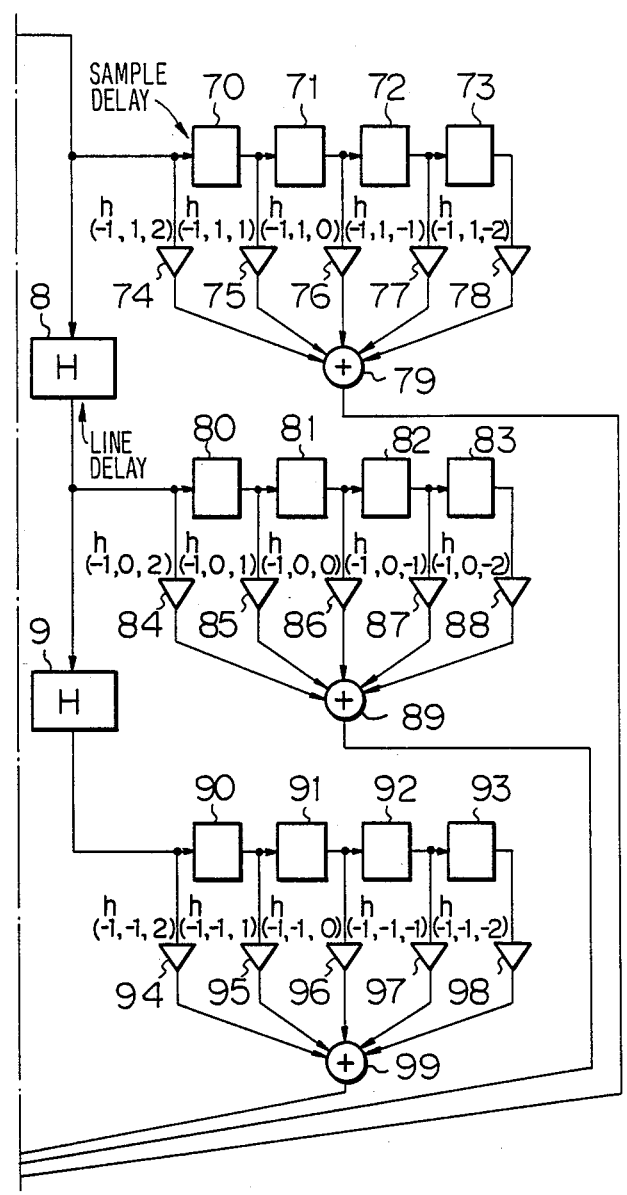
Fig. IC

Fig. 3

| COEFFICIENT | $h_{(1,1,2)}$ | $h_{(1,1,1)}$ | $h_{(1,1,0)}$ | $h_{(1,1,-1)}$ | $h_{(1,1,-2)}$ |
|---|---|---|---|---|---|
| WEIGHT | 1 | 1 | 1/2 | 1 | 1 |

| | $h_{(1,0,2)}$ | $h_{(1,0,1)}$ | $h_{(1,0,0)}$ | $h_{(1,0,-1)}$ | $h_{(1,0,-2)}$ |
|---|---|---|---|---|---|
| | 1/2 | 1/2 | 1/4 | 1/2 | 1/2 |

| | $h_{(1,-1,2)}$ | $h_{(1,-1,1)}$ | $h_{(1,-1,0)}$ | $h_{(1,-1,-1)}$ | $h_{(1,-1,-2)}$ |
|---|---|---|---|---|---|
| | 1 | 1 | 1/2 | 1 | 1 |

| | $h_{(0,1,2)}$ | $h_{(0,1,1)}$ | $h_{(0,1,0)}$ | $h_{(0,1,-1)}$ | $h_{(0,1,-2)}$ |
|---|---|---|---|---|---|
| | 1/2 | 1/2 | 1/4 | 1/2 | 1/2 |

| | $h_{(0,0,2)}$ | $h_{(0,0,1)}$ | $h_{(0,0,0)}$ | $h_{(0,0,-1)}$ | $h_{(0,0,-2)}$ |
|---|---|---|---|---|---|
| | 1/4 | 1/4 | 1/8 | 1/4 | 1/4 |

| | $h_{(0,-1,2)}$ | $h_{(0,-1,1)}$ | $h_{(0,-1,0)}$ | $h_{(0,-1,-1)}$ | $h_{(0,-1,-2)}$ |
|---|---|---|---|---|---|
| | 1/2 | 1/2 | 1/4 | 1/2 | 1/2 |

| | $h_{(-1,1,2)}$ | $h_{(-1,1,1)}$ | $h_{(-1,1,0)}$ | $h_{(-1,1,-1)}$ | $h_{(-1,1,-2)}$ |
|---|---|---|---|---|---|
| | 1 | 1 | 1/2 | 1 | 1 |

| | $h_{(-1,0,2)}$ | $h_{(-1,0,1)}$ | $h_{(-1,0,0)}$ | $h_{(-1,0,-1)}$ | $h_{(-1,0,-2)}$ |
|---|---|---|---|---|---|
| | 1/2 | 1/2 | 1/4 | 1/2 | 1/2 |

| | $h_{(-1,-1,2)}$ | $h_{(-1,-1,1)}$ | $h_{(-1,-1,0)}$ | $h_{(-1,-1,-1)}$ | $h_{(-1,-1,-2)}$ |
|---|---|---|---|---|---|
| | 1 | 1 | 1/2 | 1 | 1 |

Fig. 4

| COEFFICIENT | $h_{(1,1,2)}$ | $h_{(1,1,1)}$ | $h_{(1,1,0)}$ | $h_{(1,1,-1)}$ | $h_{(1,1,-2)}$ |
|---|---|---|---|---|---|
| VALUE | −3 | 0 | 6 | 0 | −3 |
| | $h_{(1,0,2)}$ | $h_{(1,0,1)}$ | $h_{(1,0,0)}$ | $h_{(1,0,-1)}$ | $h_{(1,0,-2)}$ |
| | 0 | 0 | 0 | 0 | 0 |
| | $h_{(1,-1,2)}$ | $h_{(1,-1,1)}$ | $h_{(1,-1,0)}$ | $h_{(1,-1,-1)}$ | $h_{(1,-1,-2)}$ |
| | −3 | 0 | 6 | 0 | −3 |
| | $h_{(0,1,2)}$ | $h_{(0,1,1)}$ | $h_{(0,1,0)}$ | $h_{(0,1,-1)}$ | $h_{(0,1,-2)}$ |
| | 0 | 0 | 0 | 0 | 0 |
| | $h_{(0,0,2)}$ | $h_{(0,0,1)}$ | $h_{(0,0,0)}$ | $h_{(0,0,-1)}$ | $h_{(0,0,-2)}$ |
| | 0 | 32 | 64 | 32 | 0 |
| | $h_{(0,-1,2)}$ | $h_{(0,-1,1)}$ | $h_{(0,-1,0)}$ | $h_{(0,-1,-1)}$ | $h_{(0,-1,-2)}$ |
| | 0 | 0 | 0 | 0 | 0 |
| | $h_{(-1,1,2)}$ | $h_{(-1,1,1)}$ | $h_{(-1,1,0)}$ | $h_{(-1,1,-1)}$ | $h_{(-1,1,-2)}$ |
| | −3 | 0 | 6 | 0 | −3 |
| | $h_{(-1,0,2)}$ | $h_{(-1,0,1)}$ | $h_{(-1,0,0)}$ | $h_{(-1,0,1)}$ | $h_{(-1,0,-2)}$ |
| | 0 | 0 | 0 | 0 | 0 |
| | $h_{(-1,-1,2)}$ | $h_{(-1,-1,1)}$ | $h_{(-1,-1,0)}$ | $h_{(-1,-1,-1)}$ | $h_{(-1,-1,-2)}$ |
| | −3 | 0 | 6 | 0 | −3 |

Fig. 5

| COEFFICIENT | $h_{(1,1,2)}$ | $h_{(1,1,1)}$ | $h_{(1,1,0)}$ | $h_{(1,1,-1)}$ | $h_{(1,1,-2)}$ |
|---|---|---|---|---|---|
| VALUE | −24 | 0 | 24 | 0 | −24 |

| | $h_{(1,0,2)}$ | $h_{(1,0,1)}$ | $h_{(1,0,0)}$ | $h_{(1,0,-1)}$ | $h_{(1,0,-2)}$ |
|---|---|---|---|---|---|
| | 0 | 0 | 0 | 0 | 0 |

| | $h_{(1,-1,2)}$ | $h_{(1,-1,1)}$ | $h_{(1,-1,0)}$ | $h_{(1,-1,-1)}$ | $h_{(1,-1,-2)}$ |
|---|---|---|---|---|---|
| | −24 | 0 | 24 | 0 | −24 |

| | $h_{(0,1,2)}$ | $h_{(0,1,1)}$ | $h_{(0,1,0)}$ | $h_{(0,1,-1)}$ | $h_{(0,1,-2)}$ |
|---|---|---|---|---|---|
| | 0 | 0 | 0 | 0 | 0 |

| | $h_{(0,0,2)}$ | $h_{(0,0,1)}$ | $h_{(0,0,0)}$ | $h_{(0,0,-1)}$ | $h_{(0,0,-2)}$ |
|---|---|---|---|---|---|
| | 0 | 64 | 64 | 64 | 0 |

| | $h_{(0,-1,2)}$ | $h_{(0,-1,1)}$ | $h_{(0,-1,0)}$ | $h_{(0,-1,-1)}$ | $h_{(0,-1,-2)}$ |
|---|---|---|---|---|---|
| | 0 | 0 | 0 | 0 | 0 |

| | $h_{(-1,1,2)}$ | $h_{(-1,1,1)}$ | $h_{(-1,1,0)}$ | $h_{(-1,1,-1)}$ | $h_{(-1,1,-2)}$ |
|---|---|---|---|---|---|
| | −24 | 0 | 24 | 0 | −24 |

| | $h_{(-1,0,2)}$ | $h_{(-1,0,1)}$ | $h_{(-1,0,0)}$ | $h_{(-1,0,-1)}$ | $h_{(-1,0,-2)}$ |
|---|---|---|---|---|---|
| | 0 | 0 | 0 | 0 | 0 |

| | $h_{(-1,-1,2)}$ | $h_{(-1,-1,1)}$ | $h_{(-1,-1,0)}$ | $h_{(-1,-1,-1)}$ | $h_{(-1,-1,2)}$ |
|---|---|---|---|---|---|
| | −24 | 0 | 24 | 0 | −24 |

DIGITAL FILTER

BACKGROUND OF THE INVENTION

1. Field of the Invention

The present invention relates to a digital filter for use in, for example, filtering of image data or the like.

2. Description of the Prior Art

A filter of symmetric coefficients having linear phase characteristic is generally employed as a finite impulse response or FIR digital filter. For the filter coefficients of the FIR digital filter, in general, a value of the coefficient of the central tap is large and values of the coefficients at the ends are small. Therefore, when the filter operations are performed using multipliers of the same input word length while aligning the digits, in the case of the filter operation using a small filter coefficient for an output of the tap at the end, the operation word length of the multiplier cannot be effectively used, so that the operation word length becomes vain.

Practically speaking, in the case where a numeric value is expressed by a fixed point method whereby a sign bit is expressed by the MSB and a decimal point appears immediately after the MSB, when the word length of a coefficient $h_1$ of a large value assumes m bits, the effective word length of a coefficient $h_2$ of a small value is n bits, which are smaller than the word length of the coefficient $h_1$. Thus, $(m-n)$ bits corresponding to the difference between the word lengths of the coefficients $h_1$ and $h_2$ become the vain word length. Assuming that the input word length of the multiplier is m bits and an input data $x_1$ is m bits, the case of multiplying the data $x_1$ by the coefficients $h_1$ and $h_2$, respectively, will be now considered. In the multiplication of the input data x and the coefficient $h_1$ of a large value, both word lengths of the input data $x_1$ and the coefficient $h_1$ are equal to the input word length of the multiplier, so that the operation word length does not become vain. In the multiplication of the input data $x_1$ and the coefficient $h_2$ of a small value, however, the effective word length of the coefficient $h_2$ is expressed by n bits smaller than m bits of the input word length of the multiplier, so that $(m-n)$ bits become the vain word length. Consequently, in the case where the output data of the taps which are multiplied by the coefficients in this manner are added the portions of the respective high order bits become the vain word lengths.

To prevent such vain word lengths, such constitution that the digits of the outputs of the taps are aligned as mentioned above is not used but another method is considered in the multiplication of the input data $x_1$ and the coefficient $h_2$ whereby the coefficient $h_2$ of a small value is shifted by $(m-n)$ bits to the higher order so as to be increased by $2^{(m-n)}$ times and supplied to the multiplier. In this way, by scaling the coefficient $h_2$ of a small value and supplying it to the multiplier the effective word length of the coefficient becomes long and the multiplication output of the multiplier becomes all effective bits, so that the vain operation word length is eliminated.

However, the outputs of the taps which are multiplied by the scaled coefficients- respectively have a drawback such that their digits are not aligned by the amounts commensurate with the scaling. Therefore, it is necessary upon addition to shift the multiplied outputs of the respective taps by the amounts commensurate with the scaling so as to align their digits and then add those shifted outputs.

As described above, by supplying the scaled coefficients as inputs for multiplication, the vain operation word length is eliminated in the case where the FIR digital filter is constituted providing the multipliers of the same word length for the respective taps. However, since the filter coefficients differ for every characteristic of the filter, amounts of scaling of the multipliers also differ for every characteristic of the filter. In the case of realizing the digital filter in which the scaled coefficients are supplied as inputs for multiplication as mentioned above, different hardware must be provided for every characteristic of the digital filter, which is generally constituted by a hard-wired system for processing an image signal or the like, since the addition after the multiplication is accompanied by a bit shifting operation.

OBJECTS AND SUMMARY OF THE INVENTION

It is an object of the present invention to provide a digital filter in which hardware are not needed to be changed for every characteristic of the filter.

Another object of the invention is to provide a digital filter in which the vain operation word lengths of multipliers are eliminated.

According to the present invention, a digital filter comprising, an input terminal provided . with an input digital signal, a delay circuit connected to the input terminal and for producing a plurality of delayed digital signals each having different delay time with respect to the input digital signal, a first circuit for selectively adding the input digital signal and/or the plurality of delayed digital signals to be multiplied with one or more digital coefficient signals of same value so as to produce one or more added digital signals, a circuit for multiplying the one or more respective digital coefficient signals to the one or more added digital signals and/or one or more of the plurality of delayed digital signals, respectively a plurality of multiplied digital signals, a second circuit for adding the plurality of multiplied digital signals so as to produce an output digital signal, and a circuit connected between the delay circuit and a circuit for multiplying and for increasing the one or more added digital signals and/or the one or more of the plurality of delayed digital signals in the value thereof by one or more predetermined numbers of times, whereby the one or more respective digital coefficient signals have inversely proportional values corresponding to the one or more predetermined numbers of times of the values of the one or more added digital signals and/or the one or more of the plurality of delayed digital signals.

Further, a digital filter comprising, an input terminal provided with an input digital signal, a plurality of frame delay circuits connected to the input terminal in series, first digital adding circuits selectively connected to the input terminal or respective outputs of the plurality of frame delay circuits at inputs thereof, respectively, a plurality of line delay circuits connected to an output of the first digital adding circuits in series, second digital adding circuits selectively connected to the output of the first digital adding circuits or respective outputs of the plurality of line delay circuits at inputs thereof, respectively, a plurality of sample delay circuits connected to an output of the second digital adding circuits in series, third digital adding circuits selectively connected to the output of the second digital signal adding circuits or respective outputs of the plurality of sample delay circuits at inputs thereof, respectively, a plurality of multiplying circuits connected to outputs of the third digital adding circuits, respectively, and for multiplying a plurality of digital coefficient signals to the output signal of the third digital adding circuit, respectively, a fourth digital adding circuit connected to the outputs of the plurality of multiplying circuits at inputs thereof, respectively, and an output terminal connected to the output of the fourth digital adding circuit.

The above and other objects and advantages of the present invention will be more apparent from the following detailed description in conjunction with the accompanying drawings.

BRIEF DESCRIPTION OF THE DRAWINGS

FIG. 1 is a diagram showing how FIGS. 1A, 1B and 1C are assembled to form a block diagram showing an example of an arrangement of a three-dimensional digital filter;

FIG. 2 is a diagram showing how

FIG. 3 is a schematic diagram for use in explanation of one embodiment of the invention;

FIG. 4 is a schematic diagram showing an example of filter coefficients of a three-dimensional digital filter; and FIG. 5 is a schematic diagram showing an example of coefficients in one embodiment of the invention.

DESCRIPTION OF THE PREFERRED EMBODIMENTS

One embodiment of the present invention will now be described hereinbelow with reference to the drawings. This embodiment is applied to, for example, filtering of a non-interlaced image data.

When the frame is advanced together with the time, it is assumed that the coordinate in the direction of the frame is l, the coordinate in the vertical direction is m, and the coordinate in the horizontal direction is n, and an attention is now paid to a pixel x (l, m, n). When an image data is transmitted through an FIR digital filter having an impulse response within a range of 2L+1 samples in the frame direction, 2M+1 samples in the vertical direction, and 2N+1 samples in the horizontal direction, an output (l, m, n) with respect to the pixel x (l, m, n) from the filter becomes $$y = \sum_{i=-L}^{L} \sum_{j=-M}^{M} \sum_{k=-N}^{N} h(i, j, k) \cdot x(l-i, m-j, n-k)$$

Where, h (i, j, k) is an impulse response, namely, a filter coefficient of this three-dimensional filter.

Since an image signal is generated by a horizontal scan and a vertical scan the pixel x expressed by the coordinate function can be one-dimensionally expressed by a time function as follows.

$$x(l, m, n) = x(lF + mH + n)$$

Where, F is a vertical scan period and H is a horizontal scan period. Therefore, the three-dimensional FIR digital filter for an image signal can be realized by an arrangement shown in FIG. 1.

Figure 1B:
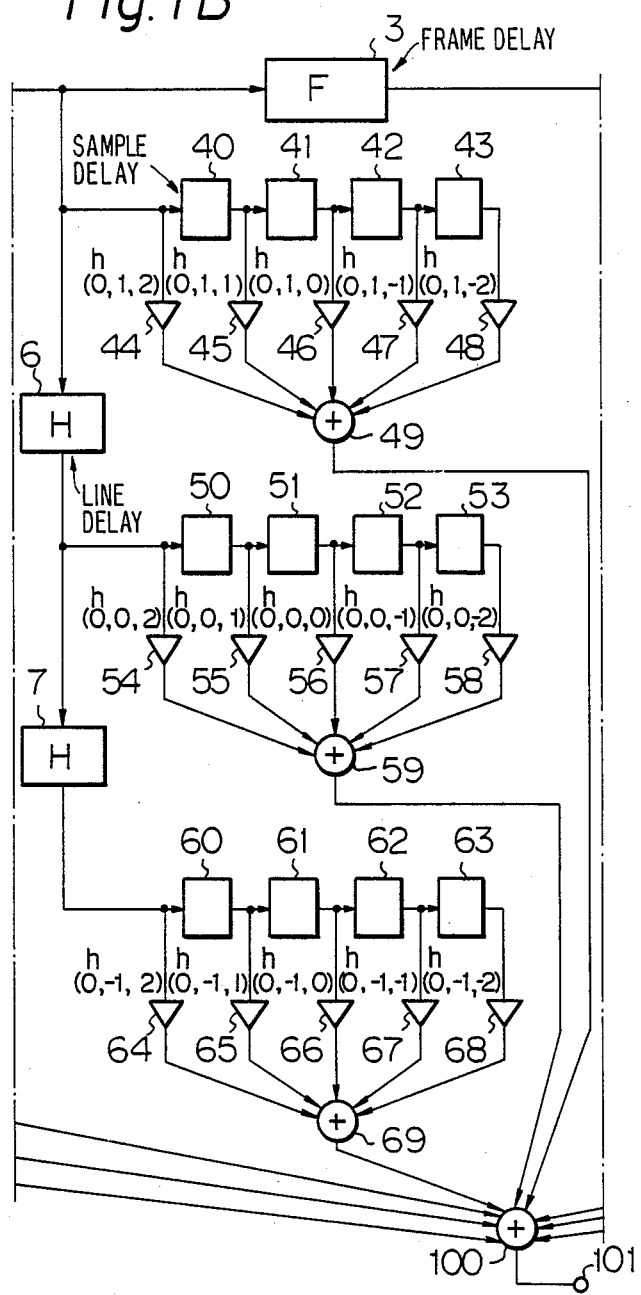

In FIG. 1, frame delay circuits 2 and 3 are cascade connected. An input terminal 1 is connected to one end of the frame delay circuit 2. A junction of the terminal 1 and delay circuit 2 is connected to one end of cascade connected line delay circuits 4 and 5. A junction of the delay circuits 2 and 3 is connected to one end of cascade connected line delay circuits 6 and 7. The other end of the delay circuit 3 is connected to one end of cascade connected line delay circuits 8 and 9.

An output at the junction of the input terminal and frame delay circuit 2 is supplied to a sum-of-products circuits which is constituted by: cascade connected sample delay circuits 10 to 13; multipliers 14 to 18 to which outputs of taps of the delay circuits 10 to 13 are supplied; and an adder 19 to which outputs of the multipliers 14 to 18 are supplied. The multipliers 14 to 18 serve to multiply filter coefficients h (1, 1, 2), h (1, 1, 1), h (1, 1, 0), h (1, 1, −1), and h (1, 1, −2), respectively.

An output of the line delay circuit 4 is supplied to a sum-of-products circuit which is constituted by: cascade connected sample delay circuits 20 to 23; multipliers 24 to 28 to which outputs of taps of the delay circuits 20 to 23 are supplied; and an adder 29 to which outputs of the multipliers 24 to 28 are supplied. The multipliers 24 to 28 serve to multiply filter coefficients h (1, 0, 2), h (1, 0, 1), h (1, 0, 0), h (1, 0, −1), and h (1, 0, −2), respectively.

An output of the line delay circuit 5 is supplied to a sum-of-products circuit which is constituted by: cascade connected sample delay circuits 30 to 33; multipliers 34 to 38 to which outputs of taps of the delay circuits 30 to 33 are supplied; and an adder 39 to which outputs of the multipliers 34 to 38 are supplied. The multipliers 34 to 38 serve to multiply filter coefficients h (1, −1, 2), h (1, −1, 1), h (1, −1, 0), h (1, −1, −1), and h (1, −1, −2), respectively.

An output at the junction of the frame delay circuits 2 and 3 is supplied to a sum-of-products circuit which is constituted by: cascade connected sample delay circuits 40 to 43; multipliers 44 to 48 to which outputs of taps of the delay circuits 40 to 43 are supplied; and an adder 49 to which outputs of the multipliers 44 to 48 are supplied. The multipliers 44 to 48 serve to multiply filter coefficients h (0, 1, 2), h (0, 1, 1), h (0, 1, 0), h (0, 1, −1), and h (0, 1, −2), respectively.

An output of the line delay circuit 6 is supplied to a sum-of-products circuit which is constituted by: cascade connected sample delay circuits 50 to 53; multipliers 54 to 58 to which outputs of taps of the delay circuits 50 to 53 are supplied; and an adder 59 to which outputs of the multipliers 54 to 58 are supplied. The multipliers 54 to 58 serve to multiply filter coefficients h (0, 0, 2), h (0, 0, 1), h (0, 0, 0), h (0, 0, −1), and h (0, 0, −2), respectively.

An output of the line delay circuit 7 is supplied to a sum-of-products circuit which is constituted by: cascade connected sample delay circuits 60 to 63; multipliers 64 to 68 to which outputs of taps of the delay circuits 60 to 63 are supplied; and an adder 69 to which output of the multipliers 64 to 68 are supplied. coefficients h (0, −1, 2), h (0, −1, 1), h (0, −1, 0), h (0, −1, −1), and h (0, −1, −2), respectively.

An output of the frame delay circuit 3 is supplied to a sum-of-products circuit which is constituted by: cascade connected sample delay circuits 70 to 73; multipliers 74 to 78 to which outputs of taps of the delay circuits 70 to 73 are supplied; and an adder 79 to which outputs of the multipliers 74 to 78 are supplied. The multipliers 74 to 78 serve to multiply filter coefficients h (−1, 1, 2), h (−1, 1, 1), h (−1, 1, 0), h (−1, 1, −1), and h (−1, 1, −2), respectively.

An output of the line delay circuit 8 is supplied to a sum-of-products circuit which is constituted by: cascade connected sample delay circuits 80 to 83; multipliers 84 to 88 to which outputs of taps of the delay circuits 80 to 83 are supplied; and an adder 89 to which outputs of the multipliers 84 to 88 are supplied. The multipliers 84 to 88 serve to multiply filter coefficients h (−1, 0, 2), h (−1, 0, 1), h (−1, 0, 0), h (−1, 0, −1), and h (−1, 0, −2), respectively.

An output of the line delay circuit 9 is supplied to a sum-of-products circuit which is constituted by: cascade connected sample delay circuits 90 to 93; multipliers 94 to 98 to which outputs of taps of the delay circuits 90 to 93 are supplied; and an adder 99 to which outputs of the multipliers 94 to 98 are supplied. The multipliers 94 to 98 serve to multiply filter coefficients h (−1, −1, 2), h (−1, −1, 1), h (−1, −1, 0), h (−1, −1, −1), and h (−1, −1, −2), respectively.

Outputs of the adders 19, 29, 39, 49, 59, 69, 79, 89, and 99 are supplied to an adder 100. An output terminal 101 is led out from the adder 100 and a filter output is derived from the output terminal 101.

In the three-dimensional digital filter which is used for an image signal, a filter of linear phase characteristic is often employed. The filter of the linear phase characteristic is a filter in which impulse responses are symmetrical with regard to the horizontal, vertical, and frame directions, namely, filter coefficients are symmetrical. In FIR filters having such symmetrical filter coefficients, it has been known that the number of multipliers can be reduced by multiplying the filter coefficients after preliminarily adding both data to be multiplied by same filter coefficient.

Figure 2A:
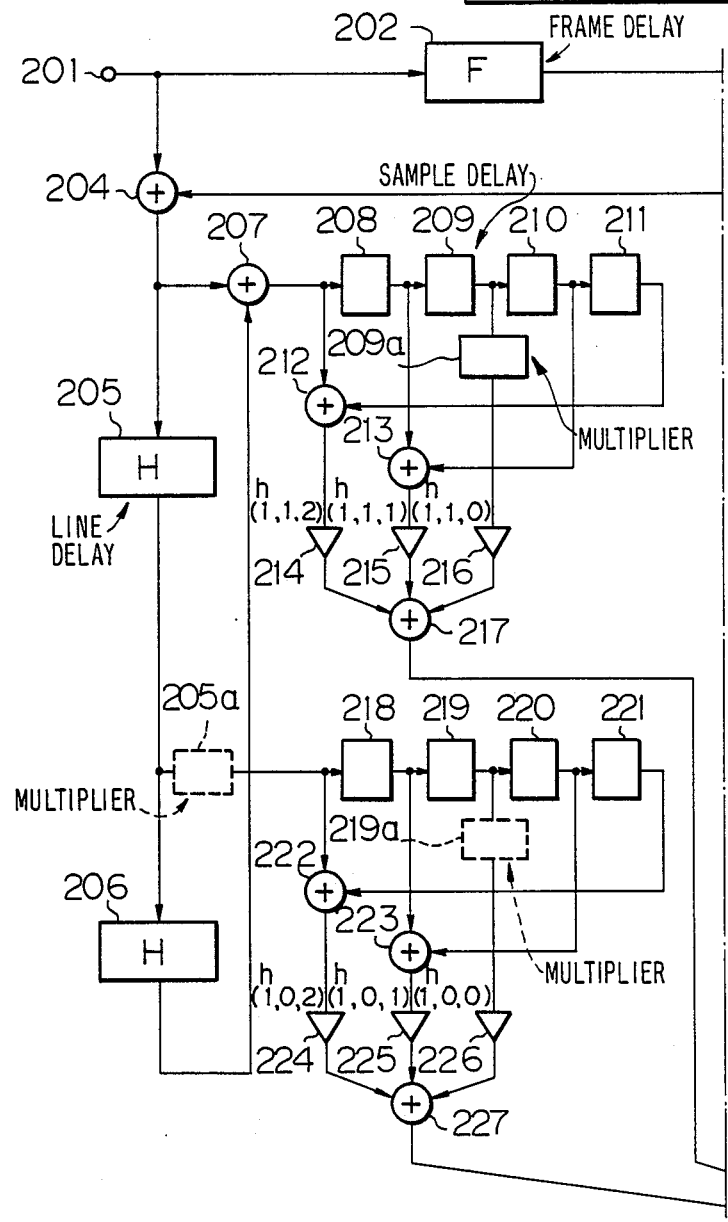
FIGS. 2A and 2B are assembled to form a block diagram showing an embodiment of the present invention.
Figure 2B:
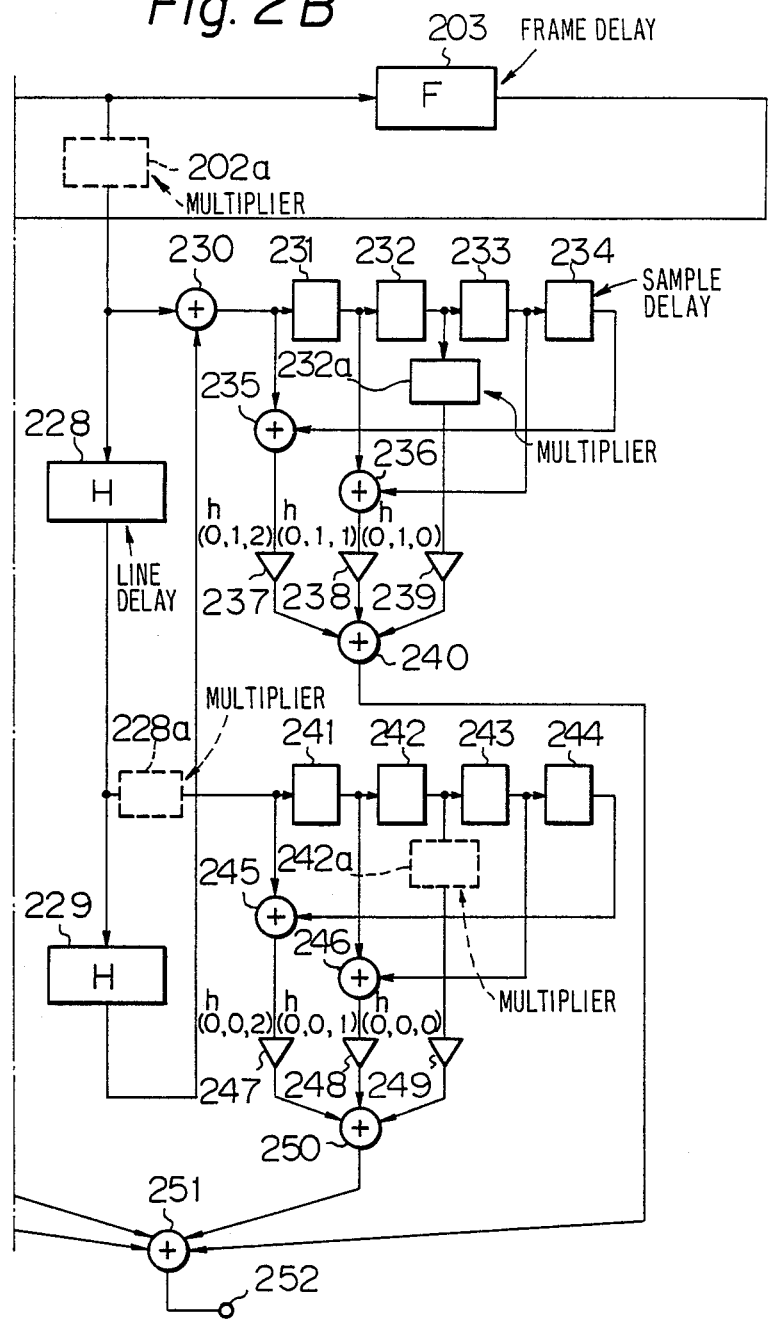

FIG. 2 shows an embodiment of the present invention. This embodiment intends to reduce the number of multipliers by using the symmetrical property of the filter coefficients as mentioned above.

In FIG. 2, frame delay circuits 202 and 203 are cascade connected. An input terminal 201 is connected to one end of the delay circuit 202. A digital image signal of, e.g., eight bits is supplied from the input terminal 201. Filter coefficients regarding tap outputs in the frame direction which are derived from the cascade connected delay circuits 202 and 203 are symmetrical. An output of the delay circuit 203 and an output at a junction of the input terminal 201 and delay circuit 202 are therefore supplied to an adder 204 so that the tap outputs in the frame direction to which the same filter coefficient is multiplied are preliminarily added.

Line delay circuits 205 and 206 are cascade connected and an output of the adder 204 is supplied to the delay circuit 205. Filter coefficients regarding the tap outputs in the vertical direction which are obtained from the cascade connected delay circuits 205 and 206 are symmetrical. The outputs of the delay circuit 206 and adder 204 are therefore supplied to an adder 207 so that the tap outputs in the vertical direction to which the same filter coefficient is multiplied are preliminarily added.

Sample delay circuits 208 to 211 are cascade connected. An output of the adder 207 is supplied to the delay circuit 208. Filter coefficients regarding the tap outputs in the horizontal direction which are obtained from the cascade connected delay circuits 208 to 211 are symmetrical. The outputs of the delay circuit 211 and adder 207 are therefore supplied to an adder 212 and the outputs of the delay circuits 210 and 208 are supplied to an adder 213 so that the outputs to which the same filter coefficient is multiplied are preliminarily added. An output of the adder 212 is supplied to a multiplier 214. An output of the adder 213 is supplied to a multiplier 215. The output of the delay circuit 209 is doubled and supplied to a multiplier 216. In this case, the parallel output of the sample delay circuit 209 may be shifted to the higher order by one bit and supplied to the multiplier or a bit shifter 209a may be separately provided. The multipliers 214, 215, and 216 serve to multiply filter coefficients h (1, 1, 2), h (1, 1, 1), and h (1, 1, 0), respectively. The filter coefficient h (1, 1, 0) is ½ of the inherent coefficient. Outputs of the multipliers 214, 215, and 216 are supplied to an adder 217. Sample delay circuits 218 to 221 are cascade connected. The output of the delay circuit 205 is supplied to the delay circuit 218. Filter coefficients regarding the tap outputs in the horizontal direction which are derived from the cascade connected sample delay circuits 218 to 221 are symmetrical. An output of the sample delay circuit 221 and the output of the line delay circuit 205 are therefore supplied to an adder 222, and outputs of the delay circuits 220 and 218 are supplied to an adder 223 so that the outputs to which the same filter coefficient is multiplied are preliminarily added. An output of the adder 222 is doubled and supplied to a multiplier 224. An output of the adder 223 is doubled and supplied to a multiplier 225. The output of the delay circuit 219 is increased by four times and supplied to a multiplier 226. The multipliers 224, 225, and 226 serve to multiply filter coefficients h (1, 0, 2), h (1, 0, 1), and h (1, 0, 0), respectively. The filter coefficients h (1, 0, 2) and h (1, 0, 1) are ½ of the inherent coefficients. The filter coefficient h (1, 0, 0) is ¼ of the inherent coefficient. Outputs of the multipliers 224 to 226 are supplied to an adder 227. In the above case, a process similar to the sample delay circuit 209 may be performed to those outputs, respectively. However, in the case where the output which is obtained at the junction of the line delay circuits 205 and 206 is shifted by one bit to a higher order by a bit shifter 205a and the output of the sample delay circuit 219 is shifted by one bit to a higher order by a bit shifter 219a, a result similar to the above can be derived.

Line delay circuits 228 and 229 are cascade connected. The output of the frame delay circuit 202 is supplied to the delay circuit 228. Filter coefficients regarding the tap outputs in the vertical direction which are derived from the cascade connected line delay circuits 228 and 229 are symmetrical. The output of the line delay circuit 229 and the output of the frame delay circuit 202 are therefore supplied to an adder 230 so that the tap outputs in the vertical direction to which the same filter coefficient is multiplied are preliminarily added.

Sample delay circuits 231 to 234 are cascade connected. An output of the adder 230 is supplied to the delay circuit 231 Filter coefficients regarding the tap outputs in the horizontal direction which are obtained from the cascade connected delay circuits 231 to 234 are symmetrical. The output of the sample delay circuit 234 and the output of the adder 230 are therefore supplied to an adder 235, and the outputs of the delay circuits 233 and 231 are supplied to an adder 236 so that the outputs to which the same filter coefficient is multiplied are preliminarily added. An output of the adder 235 is doubled and supplied to a multiplier 237. An output of the adder 236 is doubled and supplied to a multiplier 238. The output of the delay circuit 232 is increased by four times and supplied to a multiplier 239. The multipliers 237, 238, and 239 serve to multiply filter coefficients h (0, 1, 2), h (0, 1, 1), and h (0, 1, 0), respectively. The filter coefficients h (0, 1, 2) and h (0, 1, 1) are ½ of the inherent coefficients. The filter coefficient h (0, 1, 0) is ¼ of the inherent coefficient. Outputs of the multipliers 237, 238, and 239 are supplied to an adder 240. In the above case as well, a process similar to the sample delay circuit 209 may be performed to those outputs, respectively. However, in the case where the output which is obtained at the junction of the frame delay circuits 202 and 203 is shifted by one bit to a higher order by a bit shifter 202a at the output of the sample delay circuit 232 is shifted by one bit to a higher order by a bit shifter 232a, a result similar to the above can be derived.

Sample delay circuits 241 to 244 are cascade connected. The output of the line delay circuit 228 is supplied to the delay circuit 241. Filter coefficients regarding the tap outputs in the horizontal direction which are derived from the cascade connected sample delay circuits 241 to 244 are symmetrical. The outputs of the sample delay circuit 244 and line delay circuit 228 are therefore supplied to an adder 245. And the outputs of the sample delay circuits 243 and 241 are supplied to an adder 246 so that the outputs to which the same filter coefficient is multiplied are preliminarily added. An output of the adder 245 is increased by four times and supplied to a multiplier 247. An output of the adder 246 is increased by four times and supplied to a multiplier 248. The output of the sample delay circuit 242 is increased by eight times and supplied to a multiplier 249. The multipliers 247 to 249 serve to multiply filter coefficients h (0, 0, 2), h (0, 0, 1), and h (0, 0, 0), respectively. The filter coefficients h (0, 0, 2) and h (0, 0, 1) are ¼ of the inherent coefficients The filter coefficient h (0, 0, 0) is ⅛ of the inherent coefficient. Outputs of the multipliers 247 to 249 are supplied to an adder 250. In the above case as well, a process similar to the sample delay circuit 209 may be performed to those outputs, respectively. However, in the case where the outputs which are obtained at the junctions of the frame delay circuits 202 and 203 and of the line delay circuits 228 and 229 are shifted by one bit to a higher order by bit shifters 202a and 228a and the output of the sample delay circuit 242 is shifted by one bit to a higher order by a bit shifter 242a, a result similar to the above can be derived.

Outputs of the adders 217, 227, 240, and 250 are supplied to an adder 251. An output terminal 252 is led out from the adder 251. A filter output is taken out from the output terminal 252.

As described above, with an arrangement in which data to be multiplied with the same filter coefficient is preliminarily added by using a symmetrical property of the filter coefficients, the input data of the multiplier to multiply the filter coefficient of the central tap among the input data of the multipliers to multiply the filter coefficients is not preliminarily added. Therefore in the conventional apparatus the effective word length is reduced as compared with the other input data. Thus, the effective word lengths of the input data for the filter coefficients have weights as shown in FIG. 3.

Namely, for example, when data each consisting of eight bits are added to each other the addition output is increased by one digit and becomes a data of nine bits. In this manner, the word length of the output data of the adder is longer by one bit than the effective word length of the input data. Therefore, assuming that a digital signal of, e.g., eight bits is supplied from the input terminal 201, the effective word lengths of the data which are respectively supplied to the multipliers 214 to 216, 224 to 226, 237 to 239, and 247 to 249 become as shown below.

The effective word length of the data which is supplied to the multiplier 214 is increased by three bits and becomes eleven bits since it is supplied through the adders 204, 207, and 212. The effective word length of the data which is supplied to the multiplier 215 is increased by three bits and becomes eleven bits since it is supplied through the adders 204, 207, and 213. The effective word length of the data which is supplied to the multiplier 216 is increased by two bits and becomes ten bits since it is supplied through the adders 204 and 207.

The effective word length of the data which is supplied to the multiplier 224 is increased by two bits and becomes ten bits since it is supplied through the adders 204 and 222. The effective word length of the data which is supplied to the multiplier 225 is increased by two bits and becomes ten bits since it is supplied through the adders 204 and 223. The effective word length of the data which is supplied to the multiplier 226 is increaded by one bit and becomes nine bits since it is supplied through the adder 204.

The effective word length of the data which is supplied to the multiplier 237 is increased by two bits and becomes ten bits since it is supplied through the adders 230 and 235. The effective word length of the data which is supplied to the multiplier 238 is increased by two bits and becomes ten bits since it is supplied through the adders 230 and 236. The effective word length of the data which is supplied to the multiplier 239 is increased by one bit and becomes nine bits since it is supplied through the adder 230.

The effective word length of the data which is supplied to the multiplier 247 is increased by one bit and becomes nine bits since it is supplied through the adder 245. The effective word length of the data which is supplied to the multiplier 248 is increased by one bit and becomes nine bits since it is supplied through the adder 246. The effective word length of the data which is supplied to the multiplier 249 is eight bits since it is not supplied through any adder.

As described above, by multiplying the input data of different effective word lengths using the multipliers of the same operation word length in a manner such that the digits of the output data from the multiplier are aligned, the high order bits of the operation word length cannot be effectively used in the case of the input data of a short effective word length. Therefore in the present invention the scaling of the input data is performed thereby to align the MSB of the input data and the MSB of the input for multiplication.

In other words, the data which has the weight of the effective word lengh of ⅛ is increased by eight times by shifting it by three bits. The data which has the weight of the effective word length of ¼ is increased by four times by shifting it by two bits. The data which has the weight of the effective word length of ½ is doubled by shifting it by one bit. In this way, the MSB of all input data are aligned.

In this embodiment, the multipliers of the same input word length of, e.g., eleven bits are used as the multipliers 214 to 216, 224 to 226, 237 to 239, and 247 to 249. Therefore, the input data of the multiplier 249 is increased by eight times and supplied to the multiplier 249. The input data of the multipliers 226, 239, 247, and 248 are respectively increased by four times and supplied to the multipliers 226, 239, 247, and 248. The input data of the multipliers 216, 226, 225, 237, and 238 are respectively doubled and supplied to the multipliers 216, 224, 225, 237, and 238. In this manner, the effective word lengths of all input data are set to, for example, eleven bits which are equal to the input word length of the multipliers.

When the multiplication inputs are scaled and supplied as described above, the digits of the multiplied outputs are not aligned. To correct this, the digits of the multiplication outputs are aligned by reversely scaling the filter coefficients by amounts commensurate with the scaling of the input data. Practically speaking the filter coefficient regarding the data which has the weight of the word length of $\frac{1}{8}$ is set to the coefficient of $\frac{1}{8}$. The filter coefficient regarding the data which has the weight of the word length of $\frac{1}{4}$ is set to the coefficient of $\frac{1}{4}$. The filter coefficient regarding the data which has the weight of the word length of $\frac{1}{2}$ is set to the coefficient of $\frac{1}{2}$. Thus, the digits of the multiplication outputs can be aligned.

In this embodiment, the coefficient of the multiplier 249 is $\frac{1}{8}$. The coefficients of the multipliers 226, 239, 247, and 248 are decreased $\frac{1}{4}$, respectively. The coefficients of the multipliers 216, 224, 225, 237, and 238 are $\frac{1}{2}$, respectively. In this way, the digits of the multiplication outputs are aligned. Consequently, the outputs of the multipliers 214 to 216, the outputs of the multipliers 224 to 226, the outputs of the multipliers 237 to 239, and the outputs of the multipliers 247 to 249 are supplied to the adders 217, 227, 240, and 250 without shifting the digits, respectively, and are added.

In general, values of the filter coefficients at the ends of the impulse response are small and values of the filter coefficients near the center are large. Since the data of the central tap has a small weight of the word length as input data for the multiplication, by reversely scaling the filter coefficients as mentioned above, the values of the coefficients approach to each other and the word lengths of the coefficients are almost aligned. Consequently, even in the case of the filter coefficient of a small value at the end, the operation word length ca be effectively used without making it vain.

FIG. 4 shows an example of filter coefficients of a three-dimensional digital filter. In the case of constituting a filter of filter coefficients shown in FIG. 4 by using this embodiment, the coefficients are scaled in accordance with the weights shown in FIG. 3 and supplied to the multipliers, so that they become coefficients shown in FIG. 5. The coefficients shown in FIG. 5 are coefficients which were multiplied by the weights and thereafter increased by eight times for easy comparison with the filter coefficients shown in FIG. 4.

As shown in FIG. 5, values of the coefficients are nearly equal. Therefore, when multipliers of similar input word lengths are used as multipliers to multiply the coefficients, the vain operation word length of the multipliers are not caused.

According to the present invention, the values of the coefficients which are supplied to the multipliers to multiply the filter coefficients are almost equalized and the word lengths of the filter coefficients are nearly equalized. Therefore, even in the case of performing the filter operation of the tap of a small filter coefficient as well, the vain operation word length is not caused.

Further, there is no need to execute the scaling in accordance with the filter coefficients and the digits of the outputs of the multipliers are coincident. Thus, there is no need to change hardware for every characteristic of the filter.

Although the present invention has been shown and described with respect to a preferred embodiment, various change and modification which are obvious to a person skilled in the art to which the invention pertains are deemed to lie within the spirit and scope of the invention.

What is claimed is:

1. A digital filter comprising:
an input terminal provided with an input digital signal;
frame-delay circuit means connected to said input terminal for producing a digital signal frame-delayed with respect to said input digital signal;
first adder circuit means for adding said input and fame-delayed delayed digital signals to produce added digital signals;
line-delay circuit means connected to said output of said first adder circuit means and having an output;
second adder circuit means having a plurality of inputs respectively connected to selected ones of the output of said first adder circuit means and said output of said line-delay circuit means, and having an output;
sample-delay circuit means connected to said output of said second adder circuit means and having at least one output;
third adder circuit means having a plurality of inputs respectively connected to selected ones of the output of said second adder circuit means and said output of said sample-delay circuit means, and having a plurality of outputs;
a plurality of multiplying circuit means having inputs respectively connected to respective ones of said outputs of said third adder circuit means for respectively multiplying a plurality of digital coefficient signals by respective output signals of said third adder circuit means, and having respective outputs;
fourth adder circuit means having a plurality of inputs respectively connected to the outputs of said plurality of multiplying circuit means and having an output; and
an output terminal connected to the output of said fourth adder circuit means.

2. A digital filter comprising:
an input terminal provided with an input digital signal;
a plurality of frame delay circuit means connected in series to said input terminal and having respective outputs;
first digital adding circuit means having a plurality of inputs respectively connected to selected ones of said input terminal and said respective outputs of said plurality of frame delay circuit means, and having an output;
a plurality of line delay circuit means connected in series to said output of said first digital adding circuit means and having respective outputs;
second digital adding circuit means having a plurality of inputs respectively connected to selected ones of the output of said first digital adding circuit means and said respective outputs of said plurality of line delay circuit means, and having an output;

a plurality of sample delay circuit means connected in series to said output of said second digital adding circuit means and having respective outputs;

third digital adding circuit means having a plurality of inputs respectively connected to selected ones of the output of said second digital adding circuit means and said respective outputs of said plurality of sample delay circuit means, and having a plurality of outputs;

a plurality of multiplying circuit means having inputs respectively connected to respective ones of said outputs of said third digital adding circuit means for respectively multiplying a plurality of digital coefficient signals by respective output signals of said third digital adding circuit means, and having respective outputs;

fourth digital adding circuit means having a plurality of inputs respectively connected to the outputs of said plurality of multiplying circuit means and having an output; and an output terminal connected to the output of said fourth digital adding circuit means.

* * * * *